United States Patent
Raymond et al.

(10) Patent No.: US 10,593,827 B2
(45) Date of Patent: Mar. 17, 2020

(54) DEVICE SOURCE WAFERS WITH PATTERNED DISSOCIATION INTERFACES

(71) Applicant: X-Celeprint Limited, Cork (IE)

(72) Inventors: Brook Raymond, Cary, NC (US); Christopher Andrew Bower, Raleigh, NC (US); Matthew Meitl, Durham, NC (US); Ronald S. Cok, Rochester, NY (US)

( * ) Notice: Subject to any disclaimer, the term of this patent is extended or adjusted under 35 U.S.C. 154(b) by 0 days.

(21) Appl. No.: 16/209,380

(22) Filed: Dec. 4, 2018

(65) Prior Publication Data

US 2019/0229231 A1 Jul. 25, 2019

Related U.S. Application Data

(60) Provisional application No. 62/621,287, filed on Jan. 24, 2018.

(51) Int. Cl.

| H01L 33/32 | (2010.01) |
| H01L 33/00 | (2010.01) |
| G03F 7/20 | (2006.01) |
| G03F 7/00 | (2006.01) |

(52) U.S. Cl.
CPC .......... *H01L 33/007* (2013.01); *G03F 7/0002* (2013.01); *G03F 7/203* (2013.01); *H01L 33/0079* (2013.01); *H01L 33/0095* (2013.01); *H01L 33/32* (2013.01)

(58) Field of Classification Search
CPC ... H01L 33/32; H01L 33/007; H01L 33/0095; H01L 33/0079
See application file for complete search history.

(56) References Cited

U.S. PATENT DOCUMENTS

| 9,034,429 B2 * | 5/2015 | Bryan-Brown | B82Y 10/00 427/258 |
| 9,161,448 B2 * | 10/2015 | Menard | H01L 27/1214 |
| 10,181,483 B2 * | 1/2019 | Menard | H01L 21/76898 |
| 2007/0111198 A1 * | 5/2007 | Santore | B82Y 30/00 435/4 |
| 2008/0241989 A1 * | 10/2008 | Cok | H01L 51/0016 438/99 |

(Continued)

*Primary Examiner* — Fazli Erdem
(74) *Attorney, Agent, or Firm* — William R. Haulbrook; Michael D. Schmitt; Choate, Hall & Stewart LLP

(57) ABSTRACT

A transfer-printable (e.g., micro-transfer-printable) device source wafer comprises a growth substrate comprising a growth material, a plurality of device structures comprising one or more device materials different from the growth material, the device structures disposed on and laterally spaced apart over the growth substrate, each device structure comprising a device, and a patterned dissociation interface disposed between each device structure of the plurality of device structures and the growth substrate. The growth material is more transparent to a desired frequency of electromagnetic radiation than at least one of the one or more device materials. The patterned dissociation interface has one or more areas of relatively greater adhesion each defining an anchor between the growth substrate and a device structure of the plurality of device structures and one or more dissociated areas of relatively lesser adhesion between the growth substrate and the device structure of the plurality of device structures.

20 Claims, 15 Drawing Sheets

(56) References Cited

U.S. PATENT DOCUMENTS

| | | | | |
|---|---|---|---|---|
| 2011/0104389 A1* | 5/2011 | Bryan-Brown | ........ | B82Y 10/00 427/510 |
| 2011/0151602 A1* | 6/2011 | Speier | ................ | H01L 33/0079 438/26 |
| 2012/0027557 A1* | 2/2012 | Ashdown | ............ | H01L 21/6833 414/800 |
| 2012/0314388 A1* | 12/2012 | Bower | ................ | H01L 21/563 361/760 |
| 2013/0273695 A1* | 10/2013 | Menard | .............. | H01L 21/6835 438/118 |
| 2015/0342036 A1* | 11/2015 | Elolampi | ................ | H01L 23/13 174/254 |
| 2018/0096964 A1* | 4/2018 | Bonafede | ................ | H01L 24/81 |

\* cited by examiner

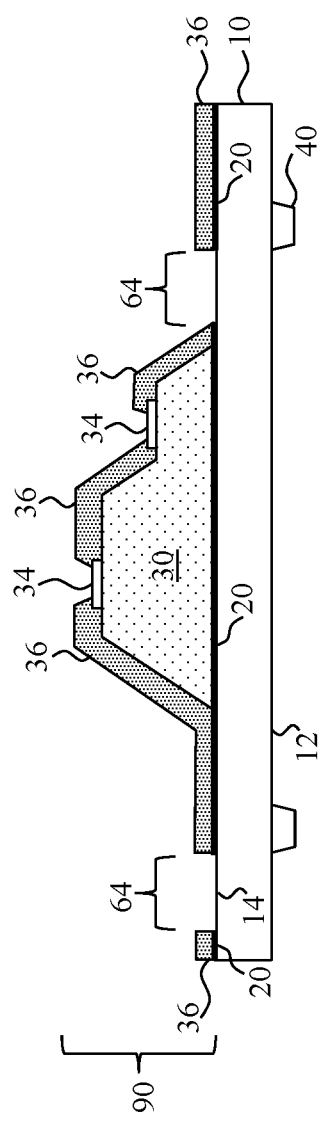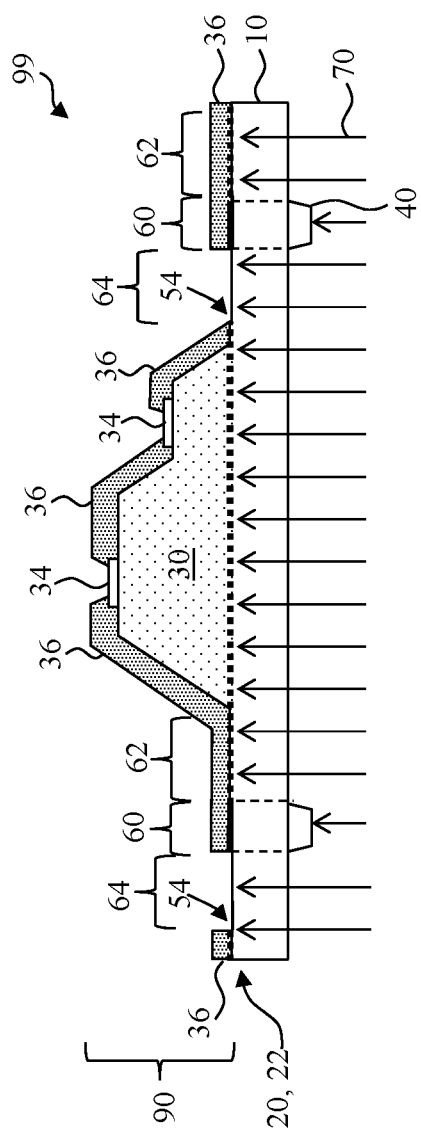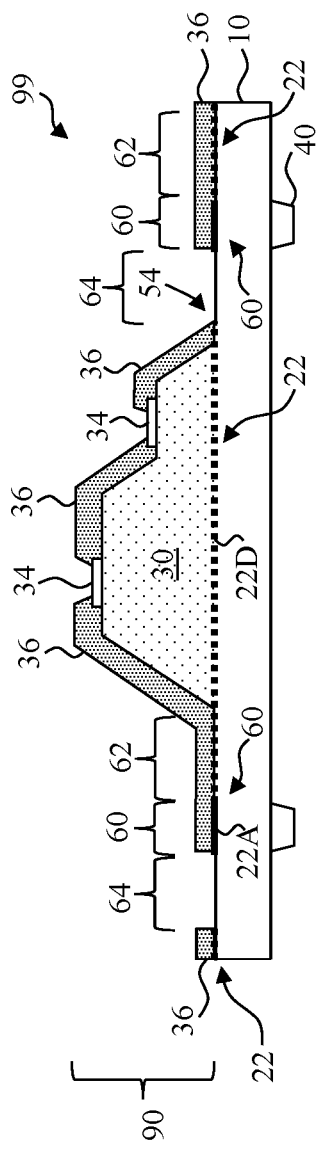

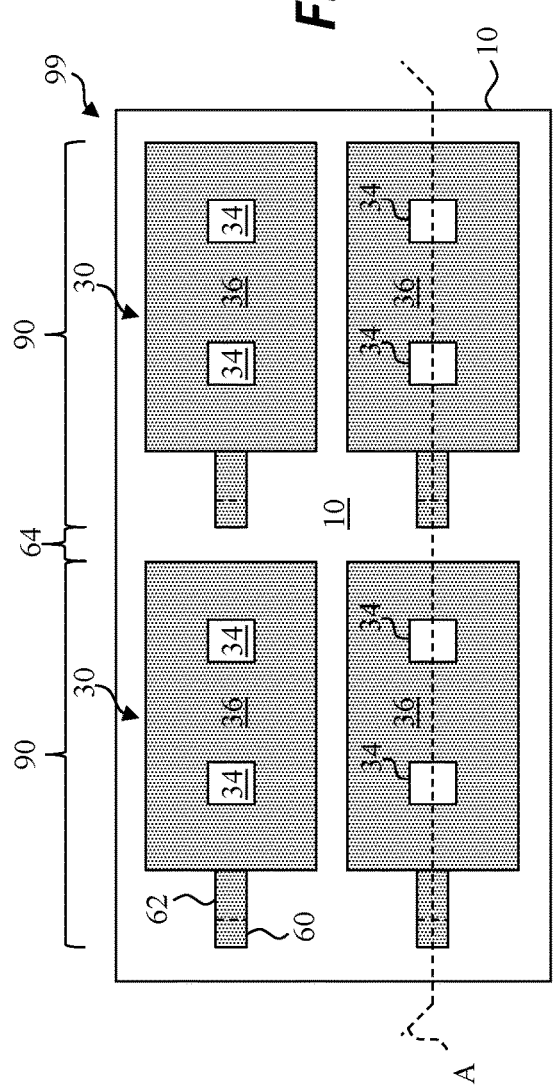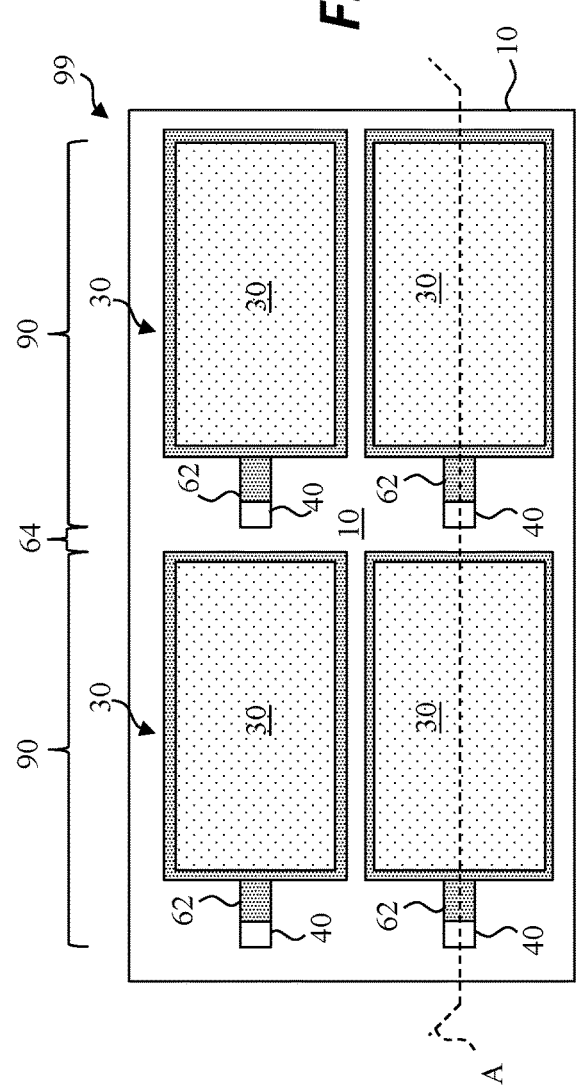

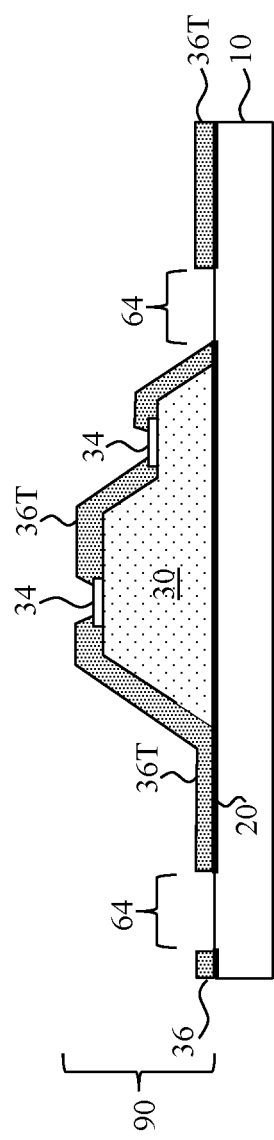
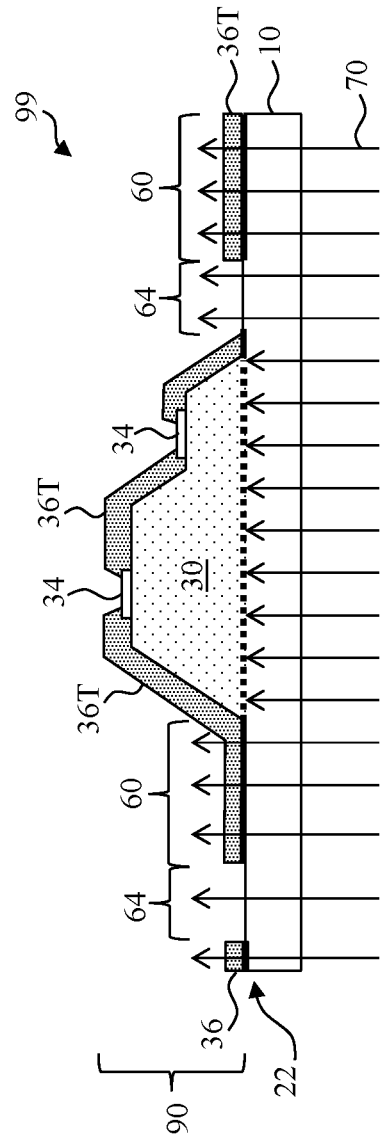
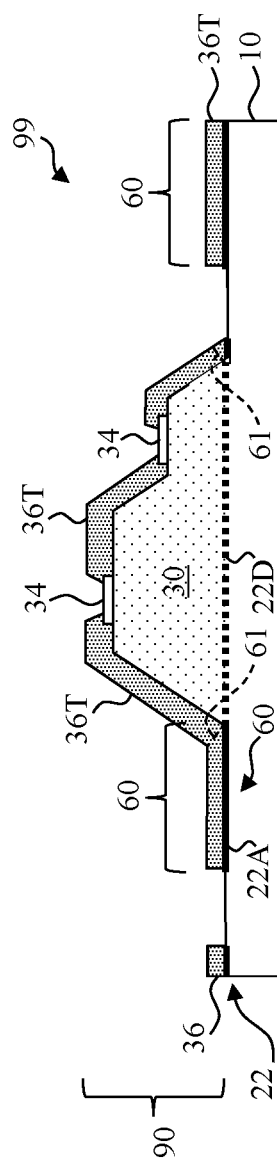

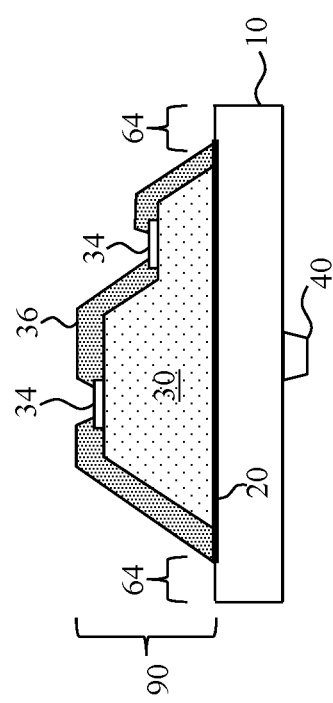
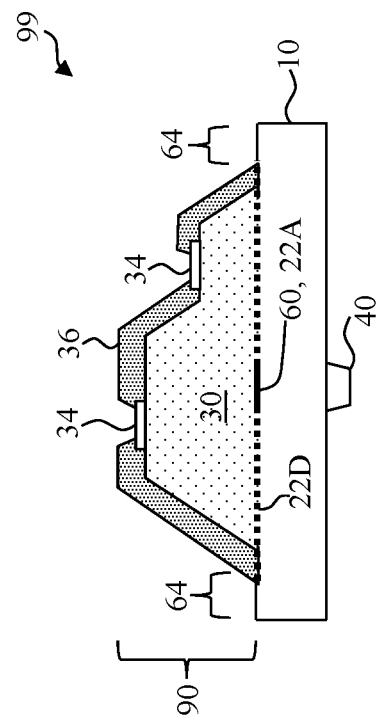

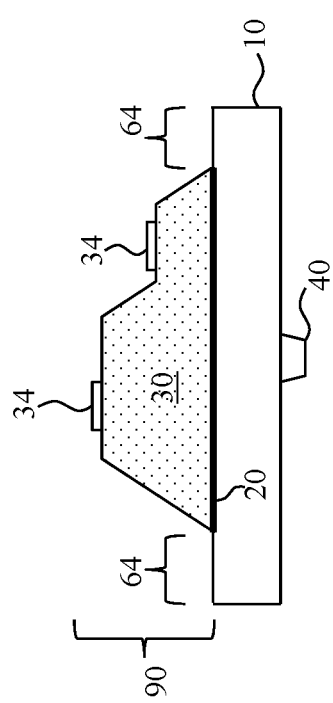
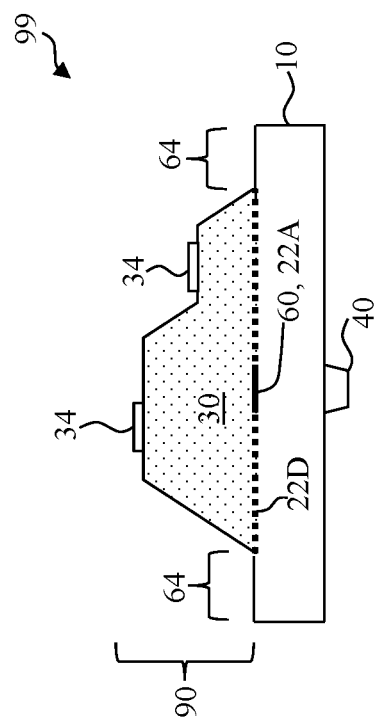

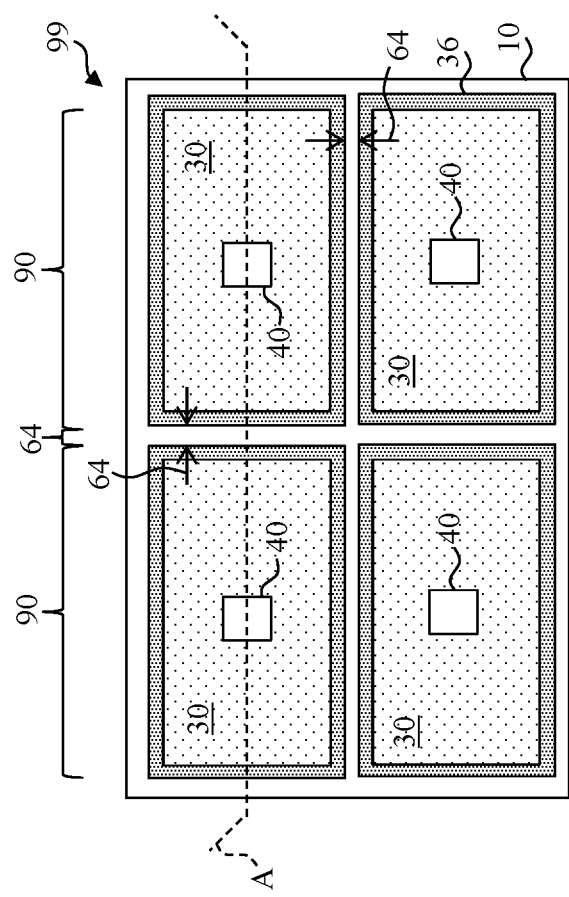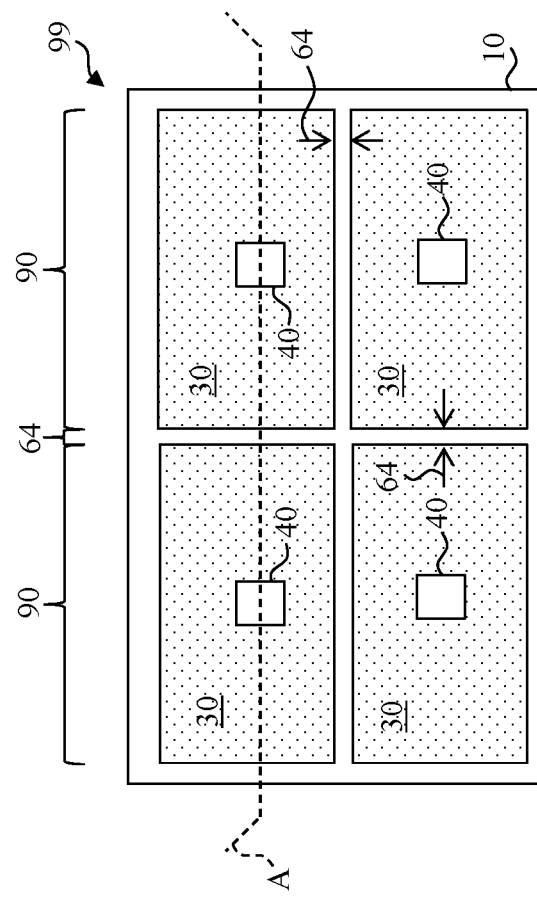

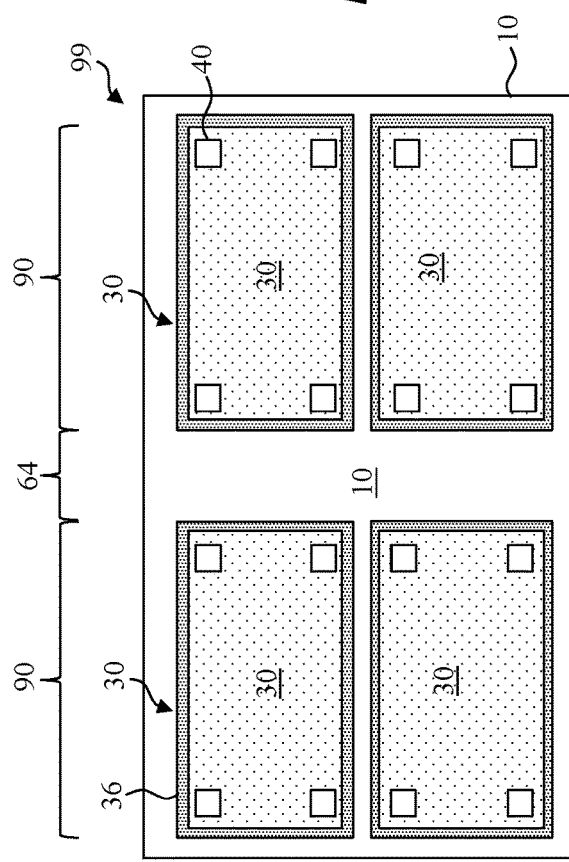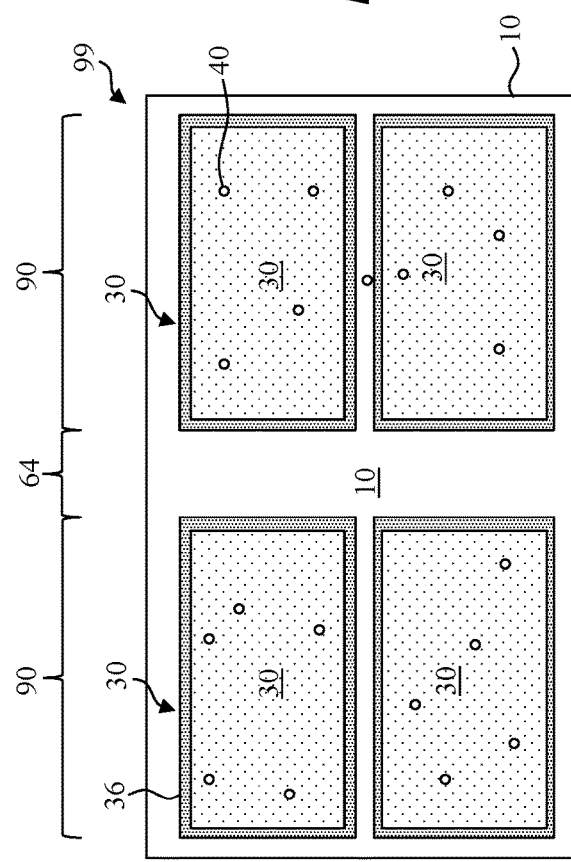

DEVICE SOURCE WAFERS WITH PATTERNED DISSOCIATION INTERFACES

PRIORITY APPLICATION

The present application claims the benefit of U.S. Provisional Patent Application No. 62/621,287, filed on Jan. 24, 2018, entitled Device Source Wafers with Patterned Dissociation Interfaces, the disclosure of which is hereby incorporated by reference herein in its entirety.

TECHNICAL FIELD

The present disclosure relates generally to structures and methods for separating devices natively formed on wafers from the wafers using electromagnetic irradiation and transfer printing (e.g., micro-transfer printing).

BACKGROUND

Electronic and optical systems typically include a variety of electronic or optical components assembled on a substrate. For example, integrated circuits, resistors, capacitors, discrete transistors, inductors, voltage regulators, and electrical connectors are often mounted together on printed-circuit boards. As electronic and optical systems become smaller and more highly integrated, ever-smaller components must be assembled on substrates. For example, surface mount components as small as 400 microns in length can be assembled on circuit boards using pick-and-place equipment.

Even smaller micro-devices having dimensions less than 100 microns can be assembled using, for example, micro-transfer printing techniques. For example, U.S. Pat. No. 8,722,458 describes transferring light-emitting, light-sensing, or light-collecting semiconductor elements from a wafer substrate to a destination substrate using a patterned elastomer stamp whose spatial pattern matches the location of the semiconductor elements on the wafer substrate. In certain embodiments of micro-transfer printing, small integrated circuit chips or chiplets are typically natively formed on a silicon substrate using photolithographic processes. The silicon substrate facilitates the formation of anchors on the wafer and tethers between the wafer and the chiplet that are broken during the micro-transfer printing process.

Micro-transfer printing can be used with a wide variety of component types in a wide variety of electronic and optical system, including processors, sensors, and energy emitters such as light-emitting diodes (LEDs). For example, CMOS devices are typically formed in silicon wafers, high-power transistors are often made using compound semiconductors such as gallium arsenide, and light-emitting devices such as light-emitting diodes are constructed in doped compound semiconductors such as gallium nitride, gallium phosphide, or gallium arsenide. These various components require a corresponding variety of materials and processing methods for making transfer printable devices that can be directly transfer printed from a native source substrate or wafer to a destination substrate. Devices that are not directly micro-transfer printed from a native wafer are typically bonded to a handle wafer (for example as taught in U.S. Pat. No. 8,934,259) or transferred using two stamp transfer steps (for example as taught in U.S. Pat. No. 8,889,485).

Electronic and optical components are usually constructed on wafers using photolithography. Different wafer materials are adapted for different device types, for example silicon wafers are used to make digital integrated circuits and sapphire or SiC substrates are commonly used with light-emitting diodes, for example. Devices can be singulated from their native substrate, for example by dicing the wafer. Alternatively, devices such as light-emitting diodes (LEDs) are removed from their native substrate by laser lift off, for example as described in *Large-area laser-lift-off processing in microelectronics*, by Delmdahl et al in Physics Procedia 41 (2013) pp. 241-248. This work describes UV laser lift-off delamination using 248 nm excimer laser sources to remove GaN LEDs from sapphire substrates. However, these methods do not provide wafers with transfer printable micro-devices.

There is a need, therefore, for methods and materials for constructing transfer printable devices on a variety of wafer types.

SUMMARY

The present disclosure provides, inter alia, structures and methods for constructing transfer-printable (e.g., micro-transfer printable) native micro-devices on a growth substrate that comprises a growth material. The growth substrate can be a wafer. In certain embodiments, the micro-transfer printable micro-devices incorporate a device material that is different from the growth material and that is relatively less transparent to a desired frequency of electromagnetic radiation than the growth material. Irradiation with a desired frequency of electromagnetic radiation partially separates the micro-devices from the growth substrate, thereby forming anchors between the micro-devices and the growth substrate and, in some embodiments, tethers physically connecting the micro-devices to the anchors. In certain embodiments, the one or more device materials are semiconductors or compound semiconductors and the substrate material is sapphire. A desired frequency of electromagnetic radiation can be infrared light, visible light, or ultraviolet light. In some embodiments, the desired frequency of electromagnetic radiation is ultraviolet light with a wavelength of 266 nm or 248 nm.

In some aspects, the present disclosure provides a micro-transfer-printable device source wafer comprising a growth substrate comprising a growth material, a plurality of device structures comprising one or more device materials different from the growth material, the device structures disposed on and laterally spaced apart over the growth substrate, each device structure comprising a device, and a patterned dissociation interface disposed between each device structure of the plurality of device structures and the growth substrate. The growth material is more transparent to a desired frequency of electromagnetic radiation than at least one of the one or more device materials. The patterned dissociation interface has one or more areas of relatively greater adhesion, each area of relatively greater adhesion defining an anchor between the growth substrate and a device structure of the plurality of device structures, and one or more dissociated areas of relatively lesser adhesion between the growth substrate and the device structure of the plurality of device structures.

In certain embodiments, the patterned dissociation interface is one or more of an atomically thin interface, an interface having a thickness of at least one atom and less than or equal to 10 atoms, an interface having a thickness greater than or equal to 0.1 nm and less than or equal to 1 nm, an interface having a thickness greater than or equal to 1 nm and less than or equal to 10 nm, an interface having a thickness greater than or equal to 10 nm and less than or equal to 100 nm, and an interface having a thickness greater than or equal to 100 nm and less than or equal to 1 micron.

In certain embodiments, the patterned dissociation interface has associated areas where the one or more device materials is undisturbed, and dissociated areas where the one or more device materials is disturbed. In certain embodiments, the patterned dissociation interface comprises a light-absorbing layer disposed on the growth substrate between the device structure and the growth substrate.

In certain embodiments, the growth material transparency is greater than or equal to 80% and the transparency of at least one of the one or more device materials is less than 80%, less than or equal to 70, or less than or equal to 50%.

In certain embodiments, each device structure comprises two or more devices.

In certain embodiments, at least one of the one or more anchors is disposed between the device and the growth substrate. In certain embodiments, at least one of the one or more anchors is disposed laterally adjacent to the device for each device structure of the plurality of device structures. In certain embodiments, one or more tethers physically connect the device to the at least one of the one or more anchors.

In certain embodiments, one or more of the one or more dissociated areas is exposed at one or more edges of the laterally spaced device structures for each device structure of the plurality of device structures. In certain embodiments, a stabilization layer is disposed over each of the plurality of device structures at least partially on a side of the device structure opposite the growth substrate and one or more vias extend through the stabilization layer to at least one of the one or more exposed edges.

In certain embodiments, at least one of the plurality of device structures comprises two or more devices and, for each of the at least one of the plurality of device structures, the two or more devices are each physically connected by a respective tether to a same anchor of the one or more anchors.

In certain embodiments, the one or more anchors are disposed randomly on the growth substrate. In certain embodiments, the one or more anchors are disposed in a regular array on the growth substrate.

In certain embodiments, a patterned dielectric layer is disposed on, over, or in contact with at least a portion of each device of the device structure and the growth substrate for each device structure of the plurality of device structures. In certain embodiments, the patterned dielectric layer is less transparent to the desired frequency of electromagnetic radiation than the growth material. In certain embodiments, the patterned dielectric layer is more transparent to the desired frequency of electromagnetic radiation than at least one of the one or more device materials. In certain embodiments, the patterned dielectric layer is physically connected with one or more of the one or more anchors. In certain embodiments, the patterned dielectric layer forms one or more tethers.

In certain embodiments, the one or more device materials each is or comprises at least one or more of a semiconductor, a crystalline semiconductor, a compound semiconductor, a crystalline compound semiconductor, GaN, GaP, GaAs, InGaN, AlGaInP, and AlGaAs. In certain embodiments, the growth material is sapphire.

In certain embodiments, the growth substrate has a growth side and an opposing mask side, the plurality of device structures is disposed on the growth side, and the micro-transfer printable device source wafer comprises a patterned mask that is less transparent than the growth material disposed on the mask side of the growth substrate in at least one or more locations, the one or more locations each corresponding to one of the one or more anchors for each device structure of the plurality of device structures. In certain embodiments, the one of the one or more anchors has an area different from an area of the patterned mask in the corresponding location.

In certain embodiments, the wafer comprises one or more faulty device structures disposed on and laterally spaced apart over the growth substrate, each faulty device structure comprising a faulty device and wherein no patterned dissociation layer is present between each faulty device structure of the one or more faulty device structures and the growth substrate.

In some aspects, the present disclosure provides a method of making a micro-transfer-printable device source wafer comprising providing a growth substrate comprising a growth material, disposing a plurality of laterally spaced-apart device structures comprising one or more device materials different from the growth material on the growth substrate, thereby forming an interface between each of the device structures and the growth substrate for each of the plurality of device structures, exposing each interface to a desired frequency of electromagnetic radiation, wherein the growth material is more transparent to the desired frequency of electromagnetic radiation than at least one of the one or more device materials, and dissociating one or more areas of the interface to form a patterned dissociation interface, wherein the patterned dissociation interface has one or more areas of relatively greater adhesion each defining an anchor between the growth substrate and each device structure of the plurality of device structures and one or more dissociated areas of relatively lesser adhesion between the growth substrate and each device structure of the plurality of device structures.

In certain embodiments, the method comprises micro-transfer printing one or more devices of the plurality of device structures from the source wafer to a destination substrate with a stamp.

In certain embodiments, one or more of the one or more dissociated areas is exposed at one or more edges of the laterally spaced device structures, and a method comprises disposing a stabilization layer over each device structure of the plurality of device structures at least partially on a side of the device structure opposite the growth substrate and forming one or more vias through the stabilization layer to at least one of the one or more exposed edges.

In certain embodiments, the growth substrate has a growth side and an opposing mask side and the plurality of device structures are disposed on the growth side, a method comprises disposing a patterned mask that is less transparent than the growth material on the mask side of the growth substrate in one or more locations corresponding to each of the one or more anchors.

In certain embodiments, the step of exposing the interface to a desired frequency of electromagnetic radiation exposes the interface to a blanket, unpatterned field of radiation. In certain embodiments, the step of exposing the interface to a desired frequency of electromagnetic radiation exposes the interface to a patterned field of radiation.

In certain embodiments, the method comprises etching the patterned dissociation interface with an etchant. In certain embodiments, the etching is liquid etching, gas etching, plasma etching, or inductively coupled plasma etching. In certain embodiments, the etchant is a gas, liquid, or plasma. In certain embodiments, the etchant is or comprises any one or more of HCl, $Cl_2$, $BCl_3$, $H_2O_2$, $XeF_2$, TMAH, and oxygen plasma.

In some aspects, the present disclosure provides a micro-transfer-printable device source wafer comprising a growth substrate comprising a growth material and a plurality of device structures comprising one or more device materials different from the growth material, the device structures disposed on and laterally spaced apart over the growth substrate forming an interface disposed between the device structure and the growth substrate, each device structure comprising a device. The growth material is more transparent to a desired frequency of electromagnetic radiation than at least one of the one or more device materials and the growth substrate has a growth side and an opposing mask side, the plurality of device structures is disposed on the growth side, and the micro-transfer printable device source wafer comprises a patterned mask that is less transparent than the growth material disposed on the mask side of the growth substrate in one or more locations each defining an anchor physically connected to a device.

In certain embodiments, the growth material transparency is greater than or equal to 80% and the transparency of at least one of the one or more device materials is less than 80%, less than or equal to 70, or less than or equal to 50%. In certain embodiments, the growth material is sapphire.

In certain embodiments, each device structure comprises two or more devices.

In certain embodiments, at least one of the one or more anchors is disposed between the device and the growth substrate.

In certain embodiments, one or more of the one or more dissociated areas is exposed at one or more edges of the laterally spaced device structures for each device structure of the plurality of device structures.

In certain embodiments, the wafer comprises a stabilization layer disposed over each of the plurality of device structures at least partially on a side of the device structure opposite the growth substrate. In certain embodiments, the wafer comprises one or more vias through the stabilization layer to at least one of the one or more exposed edges.

In certain embodiments, at least one of the one or more anchors is disposed laterally adjacent to the device for each device structure of the plurality of device structures.

In certain embodiments, the one or more anchors are disposed randomly on the growth substrate. In certain embodiments, the one or more anchors are disposed in a regular array on the growth substrate.

In certain embodiments, the wafer comprises a patterned dielectric layer disposed on, over, or in contact with at least a portion of each device of the device structure and the growth substrate for each device structure of the plurality of device structures. In certain embodiments, the patterned dielectric layer is less transparent than the growth material to the desired frequency of electromagnetic radiation. In certain embodiments, the patterned dielectric layer is more transparent than at least one of the one or more device materials to the desired frequency of electromagnetic radiation. In certain embodiments, the patterned dielectric layer is physically connected with one or more of the one or more anchors.

In certain embodiments, the one or more device materials each is or comprises at least one of a semiconductor, a crystalline semiconductor, a compound semiconductor, a crystalline compound semiconductor, GaN, GaP, GaAs, InGaN, AlGaInP, and AlGaAs.

In certain embodiments, the interface comprises a light-absorbing layer disposed on the growth substrate between the device structure and the growth substrate.

In certain embodiments, the growth substrate has a growth side and an opposing mask side, the plurality of device structures is disposed on the growth side, and the micro-transfer printable device source wafer comprises a patterned mask that is less transparent than the growth material disposed on the mask side of the growth substrate in at least one or more locations, the one or more locations each corresponding to one of the one or more anchors for each device structure of the plurality of device structures.

In certain embodiments, the one of the one or more anchors has an area different from an area of the patterned mask in the corresponding location.

In certain embodiments, the wafer comprises one or more faulty device structures disposed on and laterally spaced apart over the growth substrate, each faulty device structure comprising a faulty device and wherein no patterned dissociation layer is present between the faulty device structures of the one or more faulty device structures and the growth substrate.

Methods and structures of certain embodiments enable the construction of transfer printable (e.g., micro-transfer-printable) compound semiconductor devices on a native growth substrate without the use of any handle substrates or two stamp transfer steps.

Such transfer printable structures enable the construction of low-cost, high-performance arrays of electrically connected micro-devices (e.g., micro-LEDs) useful, for example, in display systems. For example, described herein are micro-assembled arrays of micro-devices, such as micro-LEDs, that are too small (e.g., micro-LEDs with a width, length, height and/or diameter of 0.5 μm to 50 μm; e.g., at least one of a width of 1-15 μm, a length of 5-20 μm and a height of 0.5-5 μm), numerous, or fragile to be assembled by conventional means. Rather, these arrays are assembled using transfer printing technology (e.g., micro-transfer printing technology). The micro-devices may be prepared on a native substrate and directly printed to a destination substrate (e.g., plastic, metal, glass, sapphire, transparent materials, or flexible materials), thereby obviating the manufacture of the micro-devices on the destination substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A-1C are successive cross sections illustrating sequential steps in exemplary methods having dielectric structures and a mask taken across cross section lines A of FIGS. 2A and 2B, according to illustrative embodiments of the present disclosure;

FIGS. 2A and 2B are illustrative top and bottom plan views, respectively, of the cross sections of FIGS. 1A-1C illustrating exemplary embodiments of the present disclosure;

FIGS. 3A-3C are successive cross sections illustrating sequential steps in an illustrative method having relatively transparent dielectric structures, taken across cross section lines A of FIGS. 4A and 4B, according to exemplary embodiments of the present disclosure;

FIGS. 5A and 5B are cross sections illustrating structures having an anchor between the device and the growth substrate and a patterned dielectric layer, according to illustrative embodiments of the present disclosure;

FIGS. 5C and 5D are cross sections illustrating structures having an anchor between the devices and the growth substrate without a patterned dielectric layer, taken across cross section lines A of FIGS. 6A and 6B, according to illustrative embodiments of the present disclosure;

FIGS. 6A and 6B are illustrative bottom plan views of the cross sections of FIGS. 5A-5B and FIGS. 5C-5D, respectively, illustrating exemplary embodiments of the present disclosure;

FIGS. 7A and 7B are bottom plan views of wafers having multiple anchors for each device structure, according to illustrative embodiments of the present disclosure;

Figure 4A:
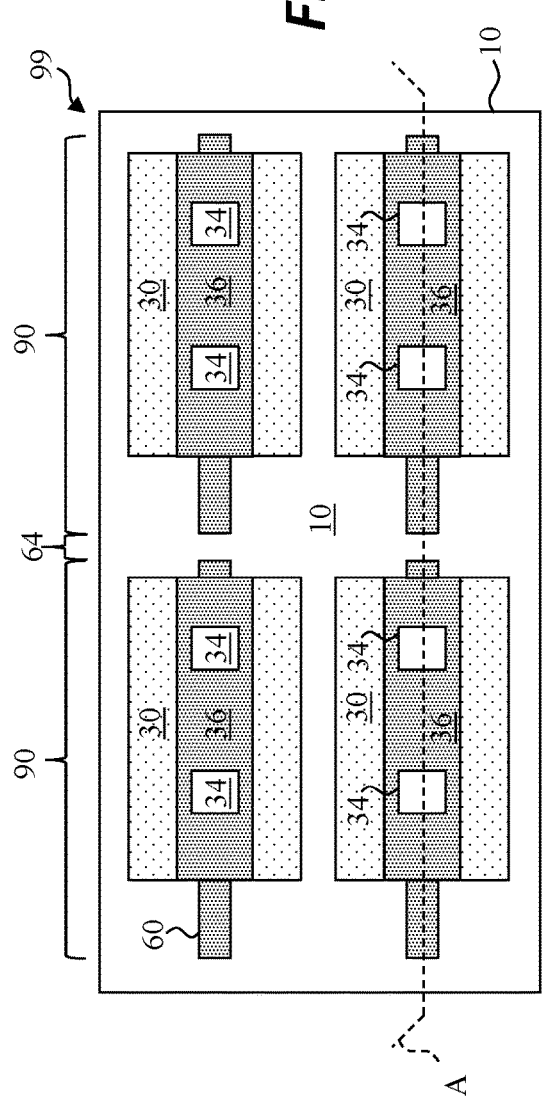
FIGS. 4A and 4B are illustrative top and bottom plan views, respectively, of the cross sections of FIGS. 3A-3C, illustrating exemplary embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, structures and methods for constructing transfer printable (e.g., micro-transfer printable) micro-devices on a substrate such as a wafer using electromagnetic irradiation. The transfer-printable micro-devices incorporate a device material that is different from the substrate material and that is relatively less transparent to a desired frequency of radiation than the substrate material. In certain embodiments, the one or more device materials each comprises one or more layers of doped or undoped semiconductor or compound semiconductor materials and the substrate material comprises sapphire. The desired frequency of radiation can be infrared light, visible light, or ultraviolet light. In some embodiments, the desired frequency of radiation is ultraviolet light with a wavelength of 266 nm or 248 nm.

According to certain embodiments and as shown in the cross section of FIG. 1C and the top and bottom plan views of FIGS. 2A and 2B, respectively, a transfer-printable device source wafer 99 comprises a growth substrate 10 comprising a growth material and a plurality of device structures 90 disposed on and laterally spaced apart over the growth substrate 10. The device structures 90 can be separated by a gap 64 that can also expose the growth substrate 10. Each device structure 90 comprises one or more device materials different from the growth material and each device structure 90 comprises a device 30 (or micro-device 30). In some embodiments, each device structure 90 comprises two or more devices 30.

A device structure 90 can optionally comprise a patterned dielectric layer 36 disposed on, over, or in contact with at least a portion of each device 30 of a device structure 90 and a portion of the growth substrate 10 for each device structure 90 of a plurality of device structures 90. A patterned dielectric layer 36 can provide environmental or electrical protection to a device 30. Suitable dielectric materials for a patterned dielectric layer 36 can be organic or inorganic and can include silicon oxides or silicon nitrides, polymers, or resins, for example curable resins, with or without additives to control the transparency or light absorption of the dielectric materials.

A patterned dissociation interface 22 is disposed between each device structure 90 of a plurality of device structures 90 and a growth substrate 10. An edge 54 of the patterned dissociation interface 22 can be exposed by a gap 64. A growth material is more transparent to a desired frequency of electromagnetic radiation than at least one of the one or more device materials. In some embodiments, the interface 20 or patterned dissociation interface 22, or both, are interfacial layers.

A patterned dissociation interface 22 has one or more associated areas 22A of relatively greater adhesion between a growth substrate 10 and a device structure 90 of a plurality of device structures 90 and one or more dissociated areas 22D of relatively lesser adhesion between a growth substrate 10 and a device structure 90 of the plurality of device structures 90. Each associated area 22A of relatively greater adhesion defines an anchor 60 between a growth substrate 10 and a device structure 90 of the plurality of device structures 90. Thus, portions of a device structure 90 corresponding to associated areas 22A of a patterned dissociation interface 22 forming anchors 60 are more strongly adhered to a growth substrate 10 than other portions of the device structure 90 corresponding to dissociated areas 22D of the device structure 90.

Figure 12:
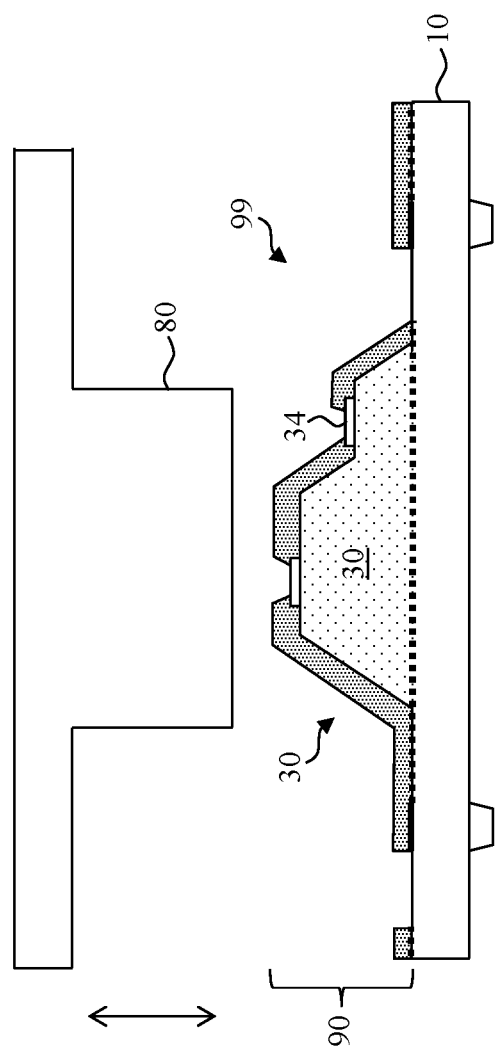
FIG. 12 is a cross section illustrating micro-transfer printing according to exemplary methods in accordance with illustrative embodiments of the present disclosure.

A portion of a patterned dielectric layer 36 can be physically connected with one or more anchors 60. Another portion of the patterned dielectric layer 36 can comprise a tether 62 physically connecting an anchor 60 to a device 30. The tether 62 can maintain the physical orientation of the device 30 with respect to the growth substrate 10 (optionally in a configuration with multiple such tethers 62) and separate or fracture when the device 30 is removed by a stamp 80 during micro-transfer printing (as shown in FIG. 12, discussed further below). The portions of the patterned dielectric layer 36 physically connected with the one or more anchors 60 and any portion of the patterned dielectric layer 36 comprising a tether 62 can comprise portions of the device structure 90. In the Figures, the brackets labeled 60 refer to the extent of the anchor 60 over the growth substrate 10. Likewise, the brackets labeled 62 refer to the extent of the tether 62. In certain embodiments, the tether 62 is the portion of the patterned dielectric layer 36 that can fracture, break or dissociate during micro-transfer printing, while the portion of the patterned dielectric layer 36 that remains in place is adhered to the anchor 60. For clarity in the Figures, not all of the anchors 60 or tethers 62 are labeled. Thus, in some embodiments, a patterned dielectric layer 36 of a device structure 90 can facilitate micro-transfer printing by providing attachment to an anchor 60 with a tether 62 for a device 30. A device structure 90 can also comprise device contacts 34 providing electrical contact to a device 30, for example metal device contacts 34 comprising aluminum, gold, silver, titanium, tantalum, tin, or conductive metal alloys. In certain embodiments, a patterned mask 40, for example a light-absorbing dielectric, can be provided on a side of a growth substrate 10 opposite a device structure 90 in alignment with locations of anchors 60 that are formed by exposure of the device structure 90 to electromagnetic radiation of a desired frequency. The patterned mask 40 can have a transparency less than the growth substrate 10.

In certain embodiments, one or more of a plurality of device structures 90 on a growth substrate 10 has an interface 10 that is not patterned to form a patterned dissociation interface 22. Devices 30 of device structures 90 that do not have any dissociated areas 22D between the device structure 90 and the growth interface 10 will not be printable (e.g., with micro-transfer device printing), since the devices 30 are relatively strongly adhered to the growth substrate 10. In some embodiments, devices 30 of device structures 90 are tested before printing and before a patterned dissociation interface 22 is formed. Those device structures 90 and devices 30 that are determined to be faulty can remain associated and strongly adhered to the growth substrate 10 to prevent their removal and the printing of faulty devices 30. Thus, in some embodiments, transfer-printable device source wafers 99 comprise one or more faulty device structures 90 disposed on and laterally spaced apart over the growth substrate 10. Each faulty device structure 90 comprises a faulty device 30 and no patterned dissociation layer 22 is present between the faulty device structures 90 of the one or more faulty device structures 90 and the growth substrate 10.

A growth substrate 10 can be any suitable substrate on which device structures 90 can be formed, grown, or constructed, for example using epitaxial deposition and photolithographic processes, where a growth substrate 10 comprises a growth material that is different from at least one of the device materials that comprise a device structure 90 or device 30. For example, a growth substrate 10 can be a wafer and can be sapphire, a semiconductor, a compound semiconductor, silicon carbide, silicon, glass, or polymer. Sapphire is a useful substrate because it has a lattice structure more closely matched to that of GaN (useful for LEDs) than silicon. Commercially available wafer substrates in a variety of material types and sizes can be used, for example an $Al_2O_3$ substrate, a Si substrate, a SiC substrate, a gallium arsenide substrate, an indium phosphide substrate, a silicon-on-insulator substrate, an epoxy-coated substrate, and a fused-silica substrate. For the purpose of this description, a growth substrate 10 can be a wafer.

An optional buffer layer (not shown in the Figures) can be formed on a growth substrate 10. The optional buffer layer can be patterned, for example in correspondence with device structure(s) 90 or in correspondence with non-anchor, dissociated areas 22D of a patterned dissociation interface 22 to enhance dissociation when irradiated with electromagnetic radiation (as shown in FIG. 1B discussed below). A buffer layer is useful for subsequent processing steps, e.g., for subsequent growth substrate 10 removal from device(s) 30 of the device structures 90 or anchors 60 to enable reuse of the growth substrate 10, to improve crystal lattice matching between a device 30 and a growth substrate 10, or to absorb desired frequencies of electromagnetic radiation. Useful buffer layer materials can include doped or undoped GaN or doped or undoped AlGaN. A buffer layer can be considered as part of a growth substrate 10 or as a separate layer formed on a growth substrate 10, or as part of a device structure 90, interface 20 (as shown in FIG. 1A discussed below), or patterned dissociation interface 22. Thus, in some embodiments, a patterned dissociation interface 22 or a device structure 90 comprises a light-absorbing or buffer layer disposed on a growth substrate 10 between a device structure 90 and a growth substrate 10.

In some embodiments, devices 30 are native to and formed on a growth substrate 10, for example made using photolithographic processes and materials deposited on the growth substrate 10. Devices 30 can be any one or more of electronic, optical, opto-electronic devices, such as integrated circuits, CMOS circuits, bipolar circuits, sensors, photo-sensors, photo-transistors, energy emitters such as electromagnetic radiation emitters, light emitters, or light-emitting diodes. Device material can include not only material of a device 30, but also other materials of a device structure 90, for example device contacts 34, a patterned dielectric layer 36, or any other materials used in a device 30 or deposited over a growth substrate 10 to form a device structure 90. Device materials can include, for example, semiconductor materials, compound semiconductor materials, dielectrics, conductors, metals, transparent conductive oxides, silicon dioxide, or silicon nitride, and can include light-absorbing or light-converting additives such as dyes or pigments or color conversion constituents (e.g., phosphors or quantum dots). Device materials can be crystalline, polycrystalline, or amorphous.

In certain embodiments, device materials comprise one or more of GaN, AlGaN, InGaN, AlInGaN, SiN, and non-epitaxial materials, such as CVD or PVD materials, and can be used, for example, in association with sapphire growth substrates. In certain embodiments, device materials comprise one or more of GaAs, InGaAlP, InGaP, InAlP, AlGaAs, (In)GaNAs(Sb), InGaAsP, (Si)Ge, SiGeSn, and non-epitaxial materials, such as CVD or PVD materials, for example, in association with gallium arsenide growth substrates. In certain embodiments, device materials comprise one or more of InGaAs, InAlGaAs, InAlAs, InGaAsP, InP, InGaAlAsP, GeSn, SiGeSn, and non-epitaxial materials, such as CVD or PVD materials, for example, in association with indium phosphide growth substrates. In certain embodiments, device materials comprise one or more of Si, SiGe, and InGaAs nanostructures, for example, in association with silicon-on-insulator growth substrates.

According to some embodiments, a growth substrate 10 must be more transparent to a desired frequency of electromagnetic radiation 70 than a component or element of a device structure 90. For example, a component or element of a device structure 90 can comprise a compound semiconductor material comprising GaN, GaAs, or GaP. Desired frequencies of radiation can include, for example, infrared light, visible light, or ultraviolet light. In some embodiments, a desired frequency of electromagnetic radiation is ultraviolet light with a wavelength of about 266 nm, about 248 nm, or about 232 nm, light with a center wavelength of about 266 nm or about 248 nm or about 232 nm, or light that includes wavelengths of about 266 nm or about 248 nm or about 232 nm. In certain embodiments, the term "approximately" or "about" refers to a range of values that fall within 5%, 4%, 3%, 2%, 1%, or less in either direction (greater than or less than) of the stated reference value unless otherwise stated or otherwise evident from the context (except where such number would exceed 100% of a possible value).

The deposition of material comprising a device structure 90 on a growth substrate 10 forms an interface 20 (shown in FIG. 1A) between the device structure 90 and the growth substrate 10, for example where the dissimilar materials of the device structure 90 and the growth substrate 10 are in contact. When patterned with incident electromagnetic radiation 70 (shown in FIG. 1B), an interface 20 becomes a patterned dissociation interface 22. In practice, an interface 20 or a patterned dissociation interface 22 can be an atomically thin layer, for example one to ten atoms (or unit cells) thick, 0.1 nm to 1 nm thick, 0.1 nm to 10 nm, 1 nm to 10 nm, 10 nm to 100 nm, or 10 nm to 1 micron thick, of a layer of the device structure 90 device material adjacent to or in contact with the growth substrate 10. In some embodiments, a patterned dissociation interface 22 can have a thickness up to 100 nm. An interface 20 or patterned dissociation interface 22 can be an interfacial layer between a growth substrate 10 and a device structure 90 and can comprise material of the device structure 90 or be a layer of the device structure 90. In some embodiments, a patterned dissociation interface 22 and an interface 20 (e.g., wherein either one or both is an interfacial layer) is a layer of a device structure 90 adjacent to a growth substrate 10.

An interface 20 can include an optional buffer layer, as discussed above, or the optional buffer layer can be a layer of material that a device structure 90 comprises specifically disposed on the growth substrate to absorb a desired frequency of radiation or can be a portion of another component of a device structure 90, for example a portion of a device 30 or a dielectric layer 36 disposed at least partly over the device 30. A growth material transparency can be greater than or equal to 80% and the transparency of at least one of the one or more device materials can be less than 80%, less than or equal to 70%, 50%, less than or equal to 20%, or substantially opaque. For example, devices 30 comprising semiconductor device materials can be substantially opaque to ultra-violet radiation and sapphire (e.g., in a sapphire substrate) can be more than 80% transparent. In certain embodiments, growth materials comprising or consisting essentially of silicon are largely transparent and device materials such as chrome or germanium are largely opaque to infrared radiation.

Figure 13:
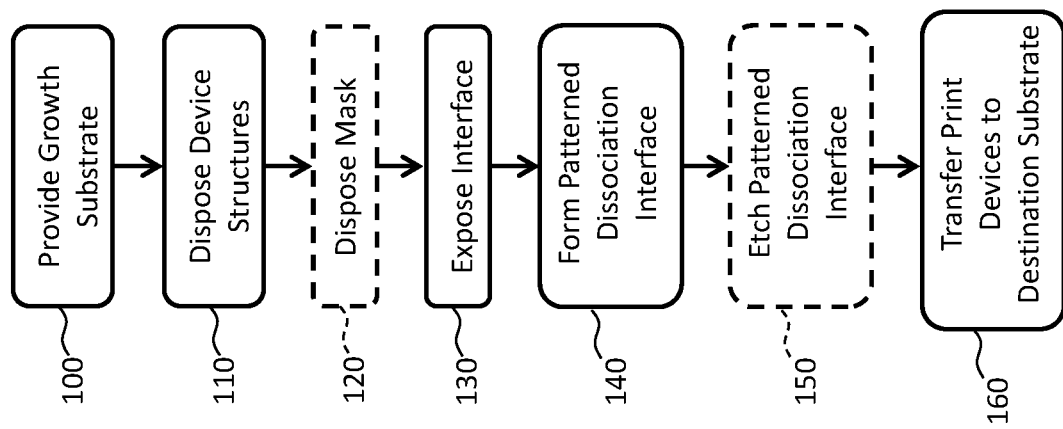

Referring to FIGS. 1A, 1B, and 1C, the top and bottom plan views of FIGS. 2A and 2B, and the flow diagram of FIG. 13, according to some embodiments, a method of making a transfer-printable device source wafer 99 (e.g., a micro-transfer-printable device source wafer) comprises providing a growth substrate 10 comprising a growth material in step 100 and disposing a plurality of laterally spaced-apart device structures 90 separated by gaps 64 comprising one or more device materials different from the growth material on the growth substrate 10, thereby forming an interface 20 between each of the device structures 90 and the growth substrate 10. Disposing each of the device structures 90 can comprise forming one or more devices 30 that are native devices formed on the growth substrate 10 and processed using photolithography to construct the device 30, for example including device contacts 34 for making electrical contact to the device material. Disposing each of the device structures 90 can also include patterning a dielectric layer 36 on at least a portion of the devices 30 and optionally on the growth substrate 10, as shown in FIG. 1A.

In step 130 and referring to FIG. 1B, each interface 20 is exposed to a desired frequency of patterned electromagnetic radiation 70 through the growth substrate 10, for example ultra-violet radiation having a wavelength of, for example, about 266 nm or about 248 nm generated by excimer lasers such as KrF pulsed lasers with a pulse width of about 25-50 ns and laser fluence of about 400-600 mJ/cm$^2$ or more, or other suitable exposure conditions. The growth material is more transparent to the desired frequency of electromagnetic radiation 70 than at least one of the one or more device materials so that the electromagnetic radiation 70 passes through the growth substrate 10, strikes the interface 20, and is at least partially absorbed by one or more of the device materials, thereby heating the absorbing material at the interface 20. The laser radiation exposure conditions, growth substrate 10 transparency, and device material transparency are selected to provide enough energy to the absorbing material to disturb the atoms of the absorbing material and dissociate one or more areas of the interface 20 to form a patterned dissociation interface 22, for example by breaking interatomic or molecular bonds of the atoms at the interface 20, in step 140, to disturb the structure or materials, or both, at the interface 20 in dissociated areas 22D. In some embodiments, an amount of material is sublimated, sputtered, or coated in step 140. Areas of the interface 20 that are not exposed to the electromagnetic radiation area associated areas 22A and remain undisturbed. The disturbed atoms and structure can form small agglomerated metallic particles and release gas. The disturbed atoms or materials (e.g., sublimated sputtered, or coated material) of the dissociated areas 22D reduces the adhesion between the growth and device materials at the interface 20, forming a pattern of areas of greater and areas of lesser adhesion corresponding to the associated areas 22A and dissociated areas 22D, respectively, of the patterned dissociation interface 22, and as shown in FIG. 1C. Thus, areas of an interface 20 that are exposed to the electromagnetic radiation 70 become dissociated areas 22D with decreased adhesion between a device structure 90 and a growth substrate 10 and areas of the interface 20 that are not exposed to the electromagnetic radiation 70 remain associated areas 22A defining anchors 60 with increased adhesion between a device structure 90 and a growth substrate 10. Steps 130 and 140 are illustrated as separate steps in FIG. 13, but the patterned dissociation interface 22 formed in step 140 can be an immediate consequence of exposing the interface 20 that essentially occurs as the exposure takes place. Thus, in certain embodiments, steps 130 and 140 could be considered to be a common step.

A relatively transparent (relatively more transparent) material is more transparent to a desired electromagnetic radiation 70 than an opaque material, relatively opaque material, or relatively less transparent material. As generally intended herein, a material, such as a growth material that is relatively more transparent than one or more of the device materials is not disturbed or dissociated (i.e., interatomic or molecular bonds are not broken in the relatively more transparent material) by exposure to electromagnetic radiation 70 of a desired frequency. A material, such as the one or more of the device materials that is relatively less transparent (more opaque) than a growth material is disturbed or dissociated (i.e., interatomic or molecular bonds are broken in the relatively less transparent material) by exposure to the electromagnetic radiation 70.

In optional step 150, a patterned dissociation interface 22 is etched by an etchant to remove disturbed or decomposed detritus from the dissociated areas 22D of the patterned dissociation interface 22. In various embodiments, the etching is any one or more of liquid etching, gas etching, plasma etching, or inductively coupled plasma etching. The etchant can be a gas, liquid, or plasma. The etchant can be or comprise any one or more of HCl, $Cl_2$, $BCl_3$, $H_2O_2$, $XeF_2$, TMAH (trimethylammonium hydroxide), and O plasma, individually, sequentially, or in combination.

To facilitate the removal of decomposed or disturbed material from a patterned dissociation interface 22, in some embodiments, one or more of the one or more dissociated areas 22D is exposed at one or more edges 54 of the laterally spaced device structures 90 for each device structure 90 of a plurality of device structures 90 (e.g., as shown in FIG. 1B). The edges 54 can be exposed at a gap 64 that also exposes the growth substrate 10. For example, and according to some embodiments, device material of a device structure 90 at an interface 20 comprises a crystalline structure of gallium nitride (GaN). Incident energy from the electromagnetic radiation 70 disturbs the device material and dissociates the gallium from the nitrogen to form atoms of gallium metal and free nitrogen. The nitrogen can escape from the patterned dissociation interface 22 at an edge 54 of the patterned dissociation interface 22. An etchant, for example HCl or hot aqueous bases can etch and dissolve the gallium metal and remove it from the dissociated areas 22D of the patterned dissociation interface 22, thereby reducing adhesion between the device structures 90 and the growth substrate 10. The dissolved material detritus can escape from the dissociated areas 22D of the patterned dissociation interface 22 through the edges 54 of the dissociated areas 22D. In some embodiments, the decomposed or disturbed materials of the dissociated areas 22D remain in place but provide reduced adhesion between the growth substrate 10 and portions of the device structure 90.

The present disclosure provides, inter alia, embodiments of micro-transfer printable devices 30 on a micro-transfer-printable device source wafer 99. In an exemplary method according to certain embodiments, referring to FIG. 12 and step 160 of FIG. 13, a stamp 80 is pressed against a device 30 to adhere the device 30 to the stamp 80. The stamp 80 can be planar or cylindrical, for example a roller in a roll-to-roll process configuration and can comprise one or more posts. The stamp 80 is then removed from the micro-transfer-printable device source wafer 99 (or vice versa) with the devices 30 and transported to a destination substrate. The removal of the devices 30 from the growth substrate 10 separates the devices 30 from the anchors 60. Where the devices 30 are physically connected to the anchors 60 with tethers 62, the tethers 62 are fractured, broken, or separated to release the devices 30 from the growth substrate 10. The devices 30 are then pressed against and adhered to the destination substrate with the stamp 80 and the stamp 80 is removed to micro-transfer print the devices 30 from the growth substrate 10 of the micro-transfer-printable device source wafer 99 to the destination substrate. Thus, the dissociated areas 22D of the patterned dissociation interface 20 adhering portions of the device structure 90 to the growth substrate 10 must be sufficiently lightly adhered to enable a stamp 80 to pick up devices 30. That is, the adhesion between the stamp 80 and the devices 30 during micro-transfer printing is greater than or equal to at least the relatively lesser adhesion between portions of the device structure 90 and the growth substrate 10 corresponding to the dissociated areas 22D of the patterned dissociation interface 20.

In micro-transfer printing, micro-structured stamps 80 (e.g., elastomeric, electrostatic stamps, or hybrid elastomeric/electrostatic stamps) can be used to pick up micro-devices 30, transport the micro-devices 30 to a destination substrate, and print the micro-devices 30 onto the destination substrate. In some embodiments, surface adhesion forces are used to control the selection and printing of these devices 30 onto the destination substrate. This process may be performed massively in parallel. The stamps 80 may be designed to transfer a single device 30 or hundreds to many thousands of discrete structures in a single pick-up and print or roll printing operation. For a discussion of micro transfer printing generally, see U.S. Pat. Nos. 7,622,367 and 8,506,867, each of which is hereby incorporated by reference in its entirety. Moreover, these micro transfer printing techniques may be used to print micro-devices 30 at temperatures compatible with assembly on plastic polymer destination substrates. In addition, semiconductor materials may be printed onto large areas of substrates thereby enabling continuous, high speed printing of complex integrated electrical circuits over large substrate areas.

Figure 14:
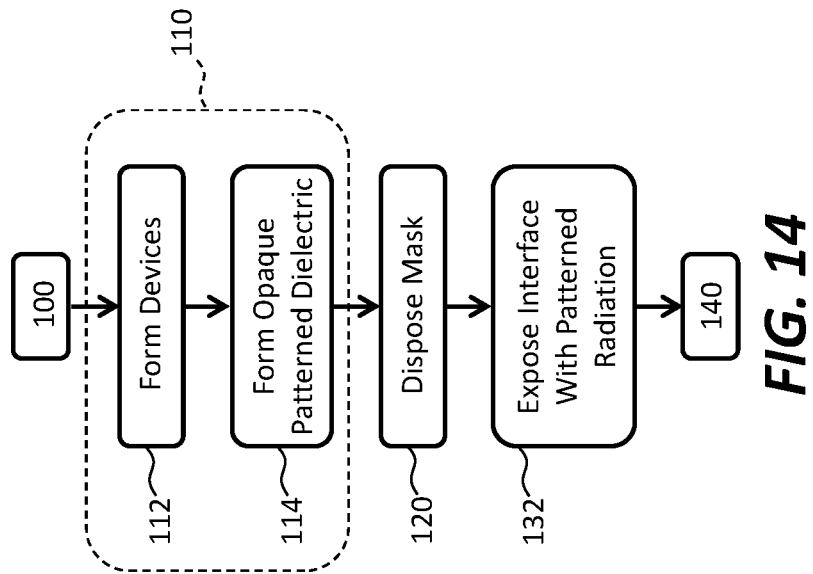
FIGS. 13-16 are flow diagrams of illustrative methods according to exemplary embodiments of the present disclosure.

According to various embodiments, electromagnetic radiation 70 is patterned using a corresponding variety of methods and structures. As shown in FIG. 1B and referring to the flow diagram of FIG. 14, after a growth substrate 10 is provided (step 100), devices 30 are formed in step 112 and an opaque patterned dielectric layer is provided in step 114 at least partially on or over each of the devices 30. An opaque patterned dielectric layer 36 is less transparent than a growth substrate 10 so that electromagnetic radiation 70 impinging on the patterned dielectric layer 36 at the interface 20 is preferentially absorbed and dissociates the dielectric materials of the patterned dielectric layer 36 from the growth substrate 10 to form dissociated areas 22D. In certain such embodiments, the material of the device 30 (e.g., a semiconductor or compound semiconductor material) in contact with the interface 20 can also absorb the electromagnetic radiation 70 and dissociate the materials of the device 30 from the growth substrate 10.

In step 120, a patterned mask 40 is disposed in at least one or more locations on a mask side 12 of a growth substrate 10 opposite a growth side 14 of the growth substrate 10 on which the device structures 90 are disposed (e.g., formed). The one or more locations each correspond to one of the one or more anchors 60 for each device structure 90 of the plurality of device structures 90. The patterned mask 40 is less transparent to the desired frequency of electromagnetic radiation 70 than the growth material disposed on the mask side 12 of the growth substrate 10 and can comprise, for example, a dielectric with light-absorbing properties such as carbon black to absorb the electromagnetic radiation 70. The patterned mask 40 can be opaque and serves to pattern the electromagnetic radiation 70 so that only the areas of the interface 20 to be dissociated are exposed to the patterned electromagnetic radiation 70. A patterned mask 40 can be constructed (step 120) using conventional materials, such as resins, and patterned using photolithographic processes, either before or after the device structures 90 are disposed (step 120) on the growth substrate 10. A radiation source (e.g., laser) can provide a blanket, unpatterned radiation field that is incident on the transfer-printable device source wafer 99 (e.g., micro-transfer-printable source wafer) and the patterned mask 40. The patterned mask 40 patterns the incident unpatterned radiation to provide patterned electromagnetic radiation 70 incident on the interface 20 to form the patterned dissociation interface 22, in step 132.

Figure 4B:
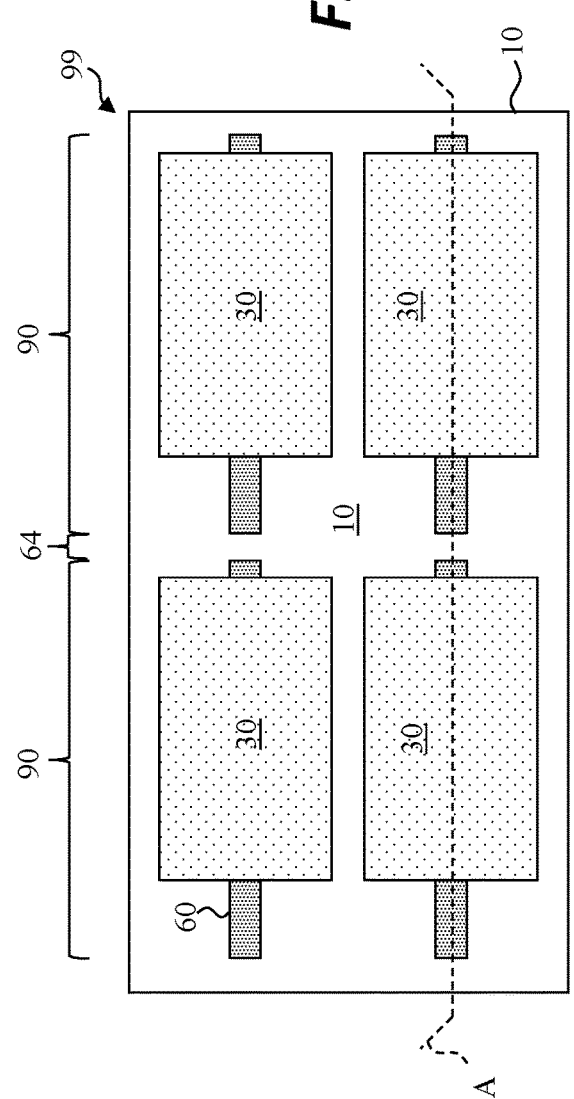

As shown in FIGS. 1B and 1C, in certain embodiments, material of a patterned dielectric layer 36 is less transparent (e.g., opaque) to a desired frequency of electromagnetic radiation 70 than at least one growth material so that the dielectric material at an interface 20 absorbs incident electromagnetic radiation 70 to dissociate from the growth material. In some embodiments and referring to the cross sections of FIGS. 3A-3C, the top and bottom plan views of FIGS. 4A-4B, and the flow diagram of FIG. 15, a growth substrate 10 is provided in step 100 and device structures disposed in step 110. A transparent patterned dielectric layer 36T is formed in step 115 and is more transparent to the desired frequency of electromagnetic radiation 70 than at least one of one or more device materials. For example, the patterned dielectric layer 36 can have a similar transparency to that of the growth material so that incident electromagnetic radiation 70 passing through the growth substrate 10 does not cause dissociation of the dielectric material at the interface 20 and the patterned dielectric layer 36 remains relatively adhered to the growth substrate 10, essentially forming the one or more anchors 60. In certain such embodiments, other device materials, for example materials making up the device 30 can have a transparency less than the growth materials (e.g., are relatively opaque) and dissociate at the interface 20 when exposed to the electromagnetic radiation 70.

Figure 15:
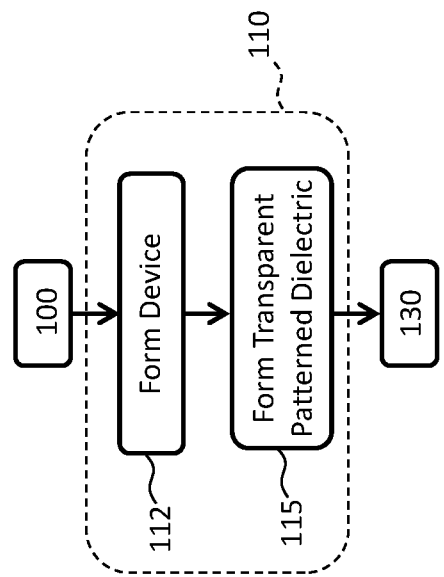

With reference still to FIGS. 3A-3C, 4A-4B, and the flow diagram of FIG. 15, the patterned dissociation interface 22 is formed as a consequence of the different transparency and electromagnetic radiation 70 absorption characteristics of the device structure 90 materials when they are irradiated. For example, as illustrated in FIG. 3B, the material of a device 30 absorbs relatively more electromagnetic radiation 70 than the patterned dielectric layer 36T so that the interface 20 corresponding to the device 30 area is dissociated, forming dissociated areas 22D, and has relatively reduced adhesion compared to the adhesion between the growth substrate 10 and the transparent patterned dielectric layer 36T. In contrast, the material of the transparent patterned dielectric layer 36T is not dissociated, remains associated areas 22A, and has relatively greater adhesion to the growth substrate 10 than the dissociated areas 22D between the device 30 and the growth substrate 10. When a device 30 is micro-transfer printed (as shown in FIG. 12 and step 160 of FIG. 13), the transparent patterned dielectric layer 36T can fracture to release the device 30 from the growth substrate 10 at fracture lines 61.

In the exemplary embodiments shown in FIGS. 1C, 2A, 2B, 3C, 4A, and 4B, at least one of the one or more anchors 60 is disposed laterally adjacent to a device 30 for each device structure 90 of the plurality of device structures 90. As shown in FIGS. 1C, 2A, and 2B, device structures 90 can comprise one or more tethers 62, for example a patterned dielectric layer 36 can define a tether 62 that physically attaches a device 30 to an anchor 60. In the exemplary embodiment shown in FIG. 3C and FIGS. 4A, 4B, no tether 62 is present, unless the fractured line 61 of the dielectric material is considered to be a tether 62.

In some embodiments and as shown in FIGS. 5A, 5B and FIG. 6A, at least one of the one or more anchors 60 is disposed between a device 30 of a device structure 90 and a growth substrate 10, for example beneath the device 30. As shown in FIGS. 5A and 6A, in some embodiments, a patterned mask 40 is disposed beneath the device 30 on a side of the growth substrate 10 opposite the device structures 90. When the interface 20 is irradiated through the growth substrate 10 (e.g., as shown in FIG. 1B or 3B), the patterned mask 40 patterns the electromagnetic radiation and the patterned dissociation interface 22 of FIG. 5B is formed. Disposing the anchors 60 beneath the device 30 increases the density of device structures 90 that can be disposed on a transfer-printable device source wafer 99 (e.g., micro-transfer-printable device source wafer), since the anchors 60 are not laterally disposed between the device structures 90. In certain such embodiments, the patterned dielectric layer 36 can be less transparent than the growth material and dissociates when irradiated by electromagnetic radiation 70 (as shown in FIG. 1B).

In some embodiments, referring to FIGS. 5C, 5D, and 6B, a patterned dielectric layer 36 in contact with the growth substrate 10 of a device structure 90 is not present. When a micro-transfer-printable device source wafer 99 in accordance with the exemplary embodiment shown in FIG. 5C having an interface 20 masked by the patterned mask 40 is exposed to blanket, unpatterned electromagnetic radiation 70 (as in FIG. 1B), a patterned dissociation interface 22 is formed (FIG. 5D) and a device structure 90 is dissociated from the growth substrate 10 except at the associated areas 22A defining the anchors 60 between the device 30 and the growth substrate 10. The device 30 can then be transfer printed (e.g., micro-transfer printed) (step 160, FIG. 13 and FIG. 12).

In the exemplary embodiments of FIGS. 5B and 5D, it is important that the associated areas 22A and anchors 60 have an area between the device 30 and the growth substrate 10 that provides enough adhesion to prevent the device 30 from undesirable movement over the growth substrate 10 but not so much adhesion that a transfer device (e.g., stamp 80) cannot remove the device 30 from the growth substrate 10 (as shown in FIG. 12 and step 160 FIG. 13). This can be accomplished by selecting a suitable associated area 22A defining the anchor 60; by increasing the associated area 22A, adhesion between a device 30 and a growth substrate 10 is increased and by decreasing the associated area 22A, adhesion between a device 30 and a growth substrate 10 is decreased.

Additional structures can be formed on devices 30 after devices 30 are micro-transfer printed onto a destination substrate. For example, patterned dielectric layers, patterned electrodes, and encapsulation layers can be formed when the devices 30 are on the destination substrate. Thus, a lack of, for example, a patterned dielectric layer 36 (e.g., as shown in FIGS. 5C, 5D) in a device structure 90 and/or a device 30 on a growth substrate 10 does not imply that such a layer cannot be provided later for the final structure on a destination substrate. Indeed, in certain embodiments, structures such as patterned electrodes are necessary in the final, completed structure after micro-transfer printing.

The exemplary embodiments of FIGS. 1C, 3C, 5B, and 5D illustrate device structures 90 adhered to a growth substrate 10 with a single anchor 60. In some embodiments, a plurality of anchors 60 adhere each device structure 90 to a growth substrate 10. Referring to FIG. 7A, a bottom plan view of a device structure 90 illustrates four anchors 60 arranged in a regular array defined by a patterned mask 40 beneath each device 30. Referring to FIG. 7B, a bottom plan view of a device structure 90 illustrates multiple anchors 60 randomly located beneath each device 30 defined by a patterned mask 40. The multiple anchors 60 of FIG. 7B are smaller in area and greater in number than the multiple anchors 60 of FIG. 7A. By using many small, randomly located anchors 60, processing and alignment requirements can be mitigated. A micro-transfer-printable device source wafer 99 in accordance with the exemplary embodiments illustrated in FIGS. 7A and 7B can be constructed using the processes and materials described with reference to FIGS. 5-5D, for example.

Figure 8:
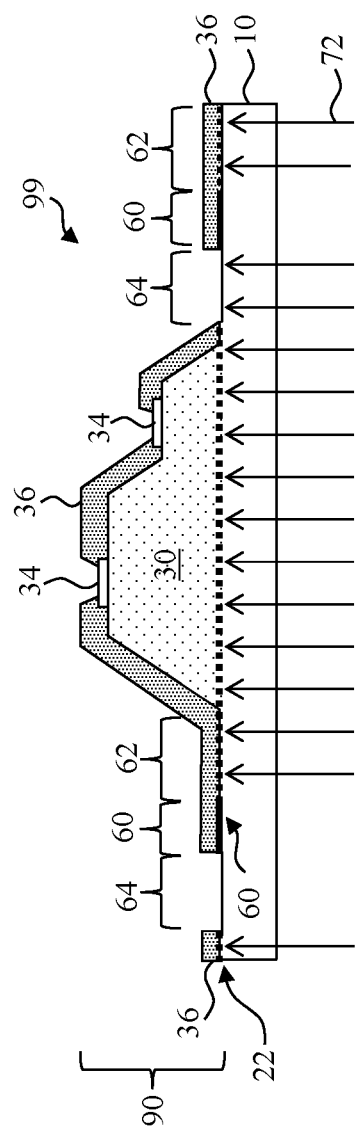
FIG. 8 is a cross section of a wafer using patterned radiation exposure without a patterned mask, according to illustrative embodiments of the present disclosure.

In the exemplary embodiment shown in FIG. 1B, unpatterned blanket electromagnetic radiation 70 is patterned with a patterned mask 40 to pattern-wise expose the interface 20 to form the patterned dissociation interface 22 and anchors 60. In the exemplary embodiment shown in FIG. 3B, the patterned device materials are selected to absorb sufficient unpatterned (e.g., blanket) electromagnetic radiation 70 to dissociate only the selected materials, thus forming a patterned dissociation interface 22 and anchors 60. In some embodiments, and as shown in FIG. 8, electromagnetic radiation 70 is itself patterned without the use of a patterned mask 40 (as shown in FIG. 1B) to pattern-wise expose areas of the interface 20 to form the patterned dissociation interface 22. For example, patterned electromagnetic radiation can be provided using structured radiation methods, diffractive structures, and the like. Another exemplary method for patterning electromagnetic radiation 70, according to some embodiments, includes the use of interfering beams of electromagnetic radiation 70 that have constructive and destructive interference patterns. Yet another exemplary method, according to some embodiments, uses modulated, rastered beams of electromagnetic radiation 70 that can leave selected areas unexposed (associated areas 22A) and dissociate the exposed areas (dissociated areas 22D). Suitable beams can include laser beams that traverse lines over the growth substrate 10, for example reflected from spinning polygons, that are temporally controlled to turn on and off, for example with electrical control or acousto-optic or MEMs modulators.

Figure 16:
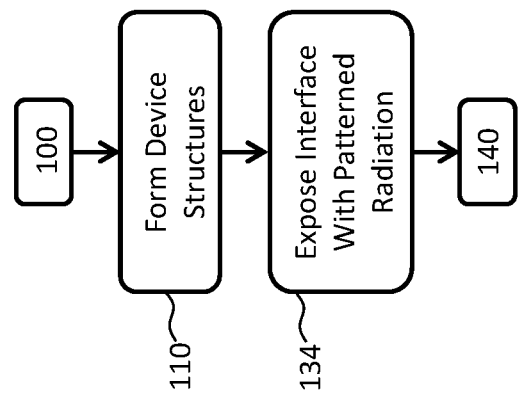

As illustrated with the exemplary method shown in FIG. 16, a growth substrate 10 is provided (step 100) and device structures 90 are disposed on the growth substrate 10 forming an interface 20 in step 110. The interface 20 is exposed to patterned electromagnetic radiation 70 in step 134 to form a patterned dissociation interface 22.

Figure 9:
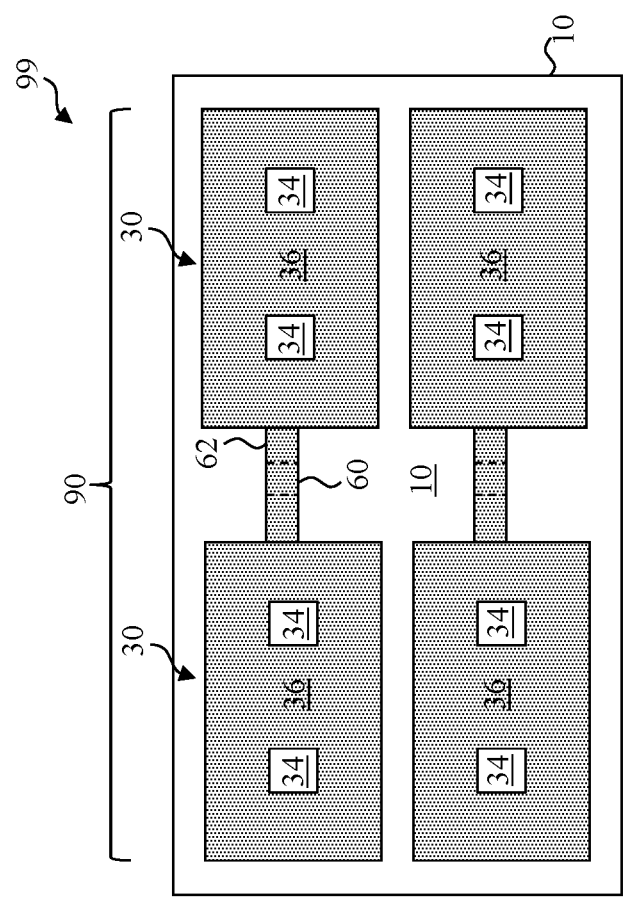
FIG. 9 is a top plan view of a wafer having shared anchors, according to illustrative embodiments of the present disclosure.

As shown in the top plan view of FIG. 9, in some embodiments, at least one of a plurality of device structures 90 in a transfer-printable device source wafer 99 comprises two or more devices 30. For each of the at least one of the plurality of device structures 90, the two or more devices 30 are each physically connected by a respective tether 62 to a same anchor 60 of the one or more anchors 60. Such arrangements of device structures 90 can increase the density of device structures 90 on a micro-transfer-printable device source wafer 99 by reducing the number and total area of anchors 60.

Figure 10:
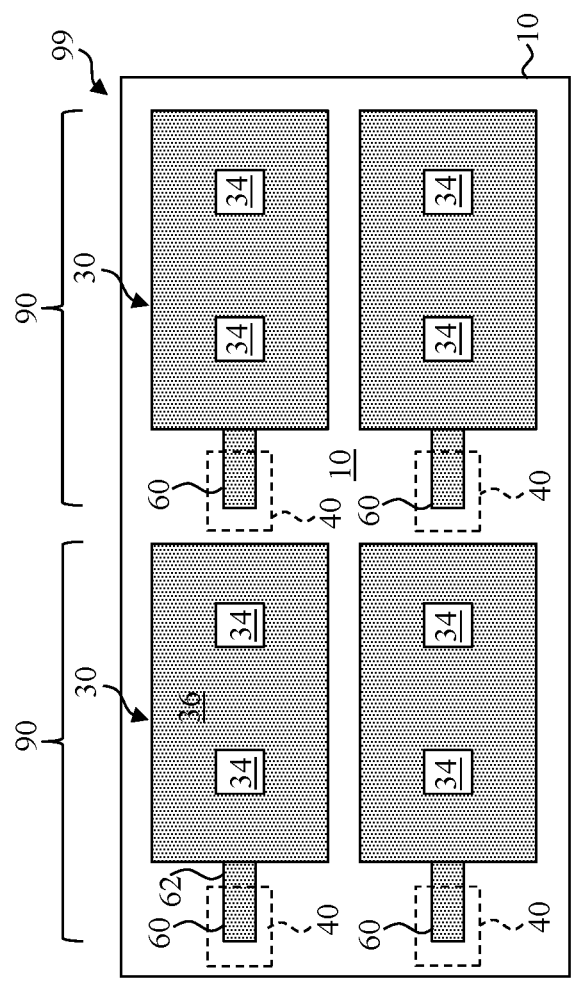
FIG. 10 is a bottom plan view of a wafer with anchors and corresponding masks of different sizes, according to illustrative embodiments of the present disclosure.

As shown in the top plan view of FIG. 10, in some embodiments, at least one of one or more anchors 60 has an area different from an area of the patterned mask 40 in a corresponding location. The anchors 60 are defined by the overlap of the patterned mask 40 and any relatively less transparent portions of a device structure 90, not just by the size of the patterned mask 40 or the relatively less transparent portions of the device structure 90. For example, gap 64 portions of the growth substrate 10 will not form an anchor 60 even if the gap 64 is obscured by the patterned mask 40 and is not irradiated with electromagnetic radiation 70. By making the anchor 60 with a different area than the patterned mask 40 in the corresponding location, alignment tolerance and registration between the patterned mask 40 on the mask side 12 of the growth substrate 10 (shown in FIG. 1B) and the device structure 90 on the growth side 14 of the growth substrate 10 (especially the patterned dielectric layer 36) is mitigated and thus can improve yields and reduce manufacturing costs. In particular, in some embodiments, a patterned mask 40 that is larger than or has a larger area than the anchor 60 is useful in reducing manufacturing costs because, in addition to mitigating alignment tolerances, it can reduce the area of the device structure 90 and especially the area of the patterned dielectric layer 36, enabling a denser arrangement of device structures 90 on the micro-transfer-printable device source wafer 99, reducing material costs.

Figure 11:
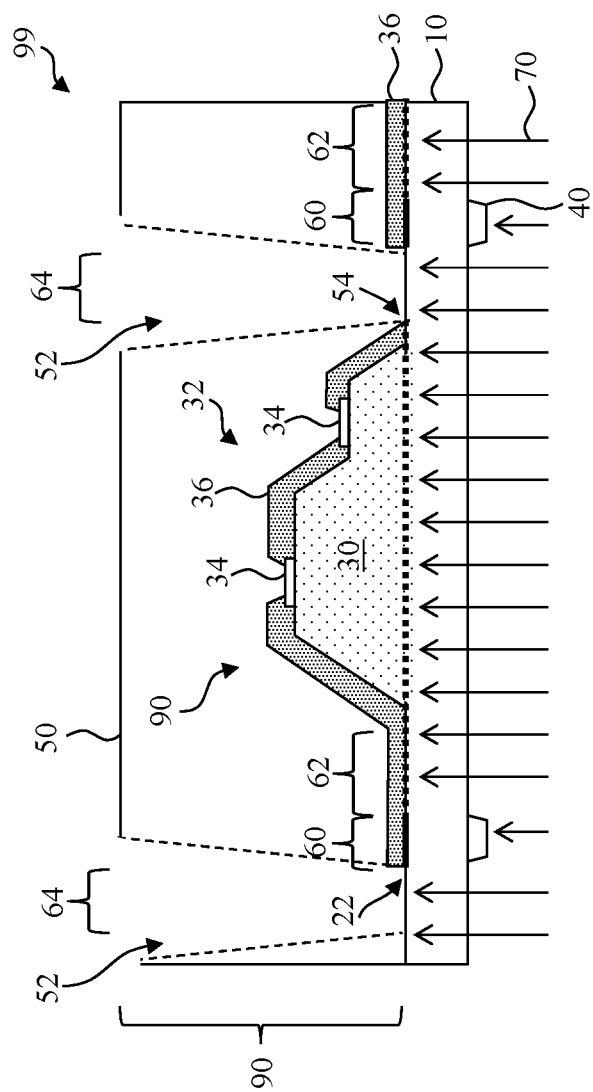
FIG. 11 is a cross section of a wafer with a stabilization layer and via, according to illustrative embodiments of the present disclosure.

Referring to FIG. 11, in an embodiment according to illustrative embodiments, a micro-transfer-printable device source wafer 99 comprises a stabilization layer 50 disposed over each of a plurality of device structures 90 at least partially on a side of the device structures 90 opposite a growth substrate 10. One or more vias 52 extend through the stabilization layer 50 to at least one of the one or more exposed edges 54. In an embodiment, the stabilization layer 50 can include a bonding layer or a handle substrate, or both. The stabilization layer 50 provides mechanical robustness to a micro-transfer-printable device source wafer 99 during handling and process steps, for example during exposure to electromagnetic radiation (step 130, FIG. 13). In certain embodiments, when a dissociation area 22D is formed, the energy applied can form a shock wave that dissociates the exposed portion of the interface 20. This shock wave could negatively affect the structural integrity of the device structure 90, for example the tether 62. A via 52 in the stabilization layer 50 enables etching the patterned dissociation interface 22 and allows decomposed materials and detritus from the patterned dissociation interface 22 to escape from the micro-transfer-printable device source wafer 99 through the stabilization layer 50 during the electromagnetic radiation 70 interface 20 electromagnetic radiation exposure (step 130).

In some embodiments and as illustrated in FIG. 1A, a micro-transfer-printable device source wafer 99 comprises a growth substrate 10 comprising a growth material and a plurality of device structures 90 comprising one or more device materials different from the growth material. The device structures 90 are disposed on and laterally spaced apart over the growth substrate 10, forming an interface 20 disposed between the device structure 90 and the growth substrate 10. Each device structure 90 comprises one or more devices 30. The growth material is more transparent to a desired frequency of electromagnetic radiation 70 than at least one of the one or more device materials. The growth substrate 10 has a growth side 14 and an opposing mask side 12. The plurality of device structures 90 can be disposed on the growth side 14. The micro-transfer printable device source wafer 99 can comprise a patterned mask 40 that is less transparent than the growth material disposed on the mask side 12 of the growth substrate 10 in one or more locations each defining an anchor 60 physically connected to a device 30.

In some embodiments, device structures 90 or devices 30 comprise one or more semiconductor layers formed on the growth substrate 10 or on a light-absorbing or buffer layer, if present. The semiconductor layers can include an n-doped semiconductor layer (also known as an n-type semiconductor layer) deposited in on the growth substrate 10 or on the buffer layer if present. A p-doped semiconductor layer (also known as a p-type semiconductor layer) can be deposited on the n-doped semiconductor layer. In some embodiments, the n- and p-doped semiconductor layers are compound semiconductor layers such as GaN semiconductor layers, for example. n- and p-doped semiconductor layers are not limited to being GaN semiconductor layers and other semiconductors and compound semiconductors are contemplated in certain embodiments of the present disclosure. The p-doped semiconductor layer can be thinner than the n-doped semiconductor layer.

Certain embodiments of the present disclosure provide a compound semiconductor device 30, such as an LED, that can be directly micro-transfer printed from a sapphire growth substrate 10 on which the compound semiconductor device 30 is formed using epitaxial deposition and photolithographic processing.

N-doped and p-doped semiconductor layers or other device materials can be disposed on the growth substrate 10 or buffer layers, if present, in some embodiments, by forming crystalline layers using molecular beam epitaxy (MBE) or metal organic chemical vapor deposition (MOCVD), for example, or other similar epitaxial, chemical vapor, or physical vapor deposition techniques. In some embodiments, the n-doped and p-doped semiconductor layers are further processed to provide crystalline semiconductor layers. Other materials can be deposited by evaporation, sputtering, or coating.

In some embodiments, n-doped and p-doped semiconductor layers are crystalline GaN. The GaN material can be doped, for example, with magnesium to form a p-type semiconductor layer or with silicon or oxygen to form an n-type semiconductor layer. The n-doped and p-doped semiconductor layers can be formed having sub-layers with different concentrations of different material, for example, to provide different sub-layers having different electrical properties. In some embodiments, the semiconductor layers include a current-transport semiconductor layer doped to provide increased electrical conductivity or transparency and one or more other semiconductor layers are doped to provide light-emitting properties in response to an electrical current passing through the semiconductor crystal (e.g., n-doped and p-doped semiconductor layers).

Device contacts 34 can be electrically conductive and can be electrically connected to electrodes (not shown in the Figures) that are also device materials that the device structure 90 comprises. In certain embodiments, device contacts 34 or electrodes supply current to a device 30 or semiconductor layers of a device 30. Device contacts 34 or electrodes can be a single layer or can include multiple sub-layers. Device contacts 34 or electrodes can be transparent, semi-transparent, or reflective and can include conductive materials such as metal oxides, indium tin oxide, aluminum zinc oxide, metals, silver, tin, aluminum, gold, titanium, tantalum, nickel, tin, platinum, palladium, or combinations or alloys thereof of these or other conductive materials. Device contacts 34 or electrodes can include conductive polymers and can be formed, for example, using physical vapor deposition or annealing and photolithographic processing.

At times, the present disclosure describes formation of a single device 30 (e.g., a micro-device 30). The same techniques and methods disclosed and described herein may be used to form arrays of these elements, devices, and/or structures. In certain embodiments, arrays of such elements, devices, and/or structures are formed such that multiple micro-devices 30 may be micro transfer printed to a destination substrate from a single growth substrate 10 using a planar or rotary stamp 80. Thus, the present disclosure contemplates the formation and micro-transfer printing of arrays of micro-devices 30 on a growth substrate 10 using the methods and techniques described herein. When formation of a single structure is described herein, it is contemplated that the same steps may be performed to an array of structures at the same time, thereby enabling the formation of arrays of micro-devices 30 for transfer printing (e.g., micro-transfer printing) to a destination substrate. For example, micro-LEDs can be formed on their native substrate with a resolution of approximately 3000 micro-LEDs per square inch (e.g., 2500-3100, 2900-3500 micro-LEDs per square inch). The device structures 90 or devices 30 can have at least one of a length of no more than 5, 10, 15, 20, 30, 50, 100, 250, or 500 μm and a width of no more than 5, 10, 15, 20, 30, 50, 100, 250, or 500 μm. In certain embodiments, device structures 90 or devices 30 have a width from 1-8 μm, 8-16 μm, or 16-50 μm. In certain embodiments, device structures 90 or devices 30 have a length from 5-10 μm, 10-20 μm, 20-50 μm, or 50-250 μm. In certain embodiments, device structures 90 or devices 30 have a height from 0.5-3 μm, 3-10 μm, or 10-25 μm.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claims.

PARTS LIST

A cross section line
10 growth substrate
12 mask side
14 growth side
20 interface
22 patterned device interface
22A associated area/area of relatively greater adhesion
22D dissociated area/area of relatively lesser adhesion
30 device/micro-device
34 device contact
36 patterned dielectric layer
36T patterned transparent dielectric layer
40 patterned mask
50 stabilization layer
52 via
54 edge of patterned dissociation interface/edge of dissociated area
60 anchor
61 fracture line
62 tether 64 gap/opening
70 electromagnetic radiation
72 patterned electromagnetic radiation
80 stamp
90 device structure
99 transfer-printable device source wafer
100 provide growth substrate step
110 dispose device structures step
112 form device step
114 form opaque patterned dielectric step
115 form transparent patterned dielectric step
120 dispose mask step
130 expose interface step
132 expose interface with unpatterned radiation step
134 expose interface with patterned radiation step
140 form patterned dissociation interface step
150 etch patterned dissociation interface step
160 transfer print devices to destination substrate step

What is claimed:

1. A transfer-printable device source wafer, comprising:
a growth substrate comprising a growth material;
a plurality of device structures comprising one or more device materials different from the growth material, the device structures disposed on and laterally spaced apart over the growth substrate, each device structure comprising a device; and
a patterned dissociation interface disposed between each device structure of the plurality of device structures and the growth substrate,
wherein the growth material is more transparent to a desired frequency of electromagnetic radiation than at least one of the one or more device materials, and
wherein the patterned dissociation interface has one or more areas of relatively greater adhesion each defining an anchor between the growth substrate and a device structure of the plurality of device structures and one or more dissociated areas of relatively lesser adhesion between the growth substrate and the device structure of the plurality of device structures.

2. The transfer-printable device source wafer of claim 1, wherein the patterned dissociation interface is one or more of an atomically thin interface, an interface having a thickness of at least one atom and less than or equal to 10 atoms, an interface having a thickness greater than or equal to 0.1 nm and less than or equal to 1 nm, an interface having a thickness greater than or equal to 1 nm and less than or equal to 10 nm, an interface having a thickness greater than or equal to 10 nm and less than or equal to 100 nm, and an interface having a thickness greater than or equal to 100 nm and less than or equal to 1 micron.

3. The transfer-printable device source wafer of claim 1, wherein each device structure comprises two or more devices.

4. The transfer-printable device source wafer of claim 1, wherein at least one of the one or more anchors is disposed between the device and the growth substrate.

5. The transfer-printable device source wafer of claim 1, wherein one or more of the one or more dissociated areas is exposed at one or more edges of the laterally spaced device structures for each device structure of the plurality of device structures.

6. The transfer-printable device source wafer of claim 5, comprising a stabilization layer disposed over each of the plurality of device structures at least partially on a side of the device structure opposite the growth substrate.

7. The transfer-printable device source wafer of claim 6, comprising one or more vias extending through the stabilization layer to at least one of the one or more exposed edges.

8. The transfer-printable device source wafer of claim 1, wherein at least one of the one or more anchors is disposed laterally adjacent to the device for each device structure of the plurality of device structures.

9. The transfer-printable device source wafer of claim 8, comprising one or more tethers physically connecting the device to the at least one of the one or more anchors.

10. The transfer-printable device source wafer of claim 1, wherein the one or more anchors are disposed randomly on the growth substrate.

11. The transfer-printable device source wafer of claim 1, comprising a patterned dielectric layer disposed on, over, or in contact with at least a portion of each device of the device structure and the growth substrate for each device structure of the plurality of device structures.

12. The transfer-printable device source wafer of claim 11, wherein the patterned dielectric layer is less transparent to the desired frequency of electromagnetic radiation than the growth material.

13. The transfer-printable device source wafer of claim 11, wherein the patterned dielectric layer is more transparent to the desired frequency of electromagnetic radiation than at least one of the one or more device materials.

14. The transfer-printable device source wafer of claim 11, wherein the patterned dielectric layer is physically connected with one or more of the one or more anchors.

15. The transfer-printable device source wafer of claim 11, wherein the patterned dielectric layer forms one or more tethers.

16. The transfer-printable device source wafer of claim 1, wherein the growth substrate has a growth side and an opposing mask side, the plurality of device structures is disposed on the growth side, and the micro-transfer printable device source wafer comprises a patterned mask that is less transparent than the growth material disposed on the mask side of the growth substrate in at least one or more locations, the one or more locations each corresponding to one of the one or more anchors for each device structure of the plurality of device structures.

17. The transfer-printable device source wafer of claim 16, wherein the one of the one or more anchors has an area different from an area of the patterned mask in the corresponding location.

18. The transfer-printable device source wafer of claim 1, wherein the patterned dissociation interface has associated areas where the one or more device materials are undisturbed and dissociated areas where the one or more device materials are disturbed.

19. The transfer-printable device source wafer of claim 1, wherein the patterned dissociation interface comprises a light-absorbing layer disposed on the growth substrate between the device structure and the growth substrate.

20. The transfer-printable device source wafer of claim 1, comprising one or more faulty device structures disposed on and laterally spaced apart over the growth substrate, each faulty device structure comprising a faulty device and wherein no patterned dissociation layer is present between each faulty device structure of the one or more faulty device structures and the growth substrate.

* * * * *